United States Patent [19]

Bean et al.

[11] Patent Number: 4,890,105

[45] Date of Patent: Dec. 26, 1989

[54] STEP DATA PROCESSOR FOR 180X AND 90X COMPASS SYNCHRO DATA

[75] Inventors: Donald E. Bean, Ruckersville; Billy M. Coleman, Fredricksburg, both of Va.

[73] Assignee: Sperry Marine Inc., Charlottesville, Va.

[21] Appl. No.: 97,975

[22] Filed: Sep. 17, 1987

[51] Int. Cl.[4] ............................................. H03M 1/64
[52] U.S. Cl. .................... 341/116; 341/114; 318/696
[58] Field of Search ............... 340/347 SY, 347 M; 318/604, 605, 654, 685, 696; 33/363 R, 363 Q; 364/559, 816; 341/110, 111, 112, 114, 116, 117, 50, 51, 55; 328/13, 14

[56] References Cited

U.S. PATENT DOCUMENTS

| | | | |
|---|---|---|---|
| 4,031,531 | 6/1977 | Rice et al. | 340/347 SY |
| 4,398,353 | 8/1983 | Wesner | 33/363 R X |
| 4,401,932 | 8/1983 | Hermansdorfer et al. | 340/347 SY X |
| 4,430,640 | 2/1984 | Hermansdorfer et al. | 341/117 |

Primary Examiner—William M. Shoop, Jr.
Assistant Examiner—Brian K. Young
Attorney, Agent, or Firm—Seymour Levine

[57] ABSTRACT

A compass data converter converts 180X and 90X synchro compass data to 1/6 degree step data. 180X synchro data is converted by utilizing a 360X to 1/6 degree step data converter that divides the synchro rotation into six 60° sectors providing a digital step data code representative thereof. A 180X converter further sub divides the 60° sectors into 30° sub sectors by selecting a synchro output in accordance with the step data code from the 360X converter and comparing the selected synchro output to ground to provide an additional step data digit. The converter for 90X data further subdivides the 30° sub-sectors into 15° intervals by selecting two synchro outputs in accordance with the 360X step data code and the additional step data digit and scaling one of the selected synchro outputs to equal the other selected synchro output at the 15° interval boundaries. A comparison of the selected unscaled synchro output and the selected scaled synchro output provides a fifth step data digit for the 90X code.

17 Claims, 3 Drawing Sheets

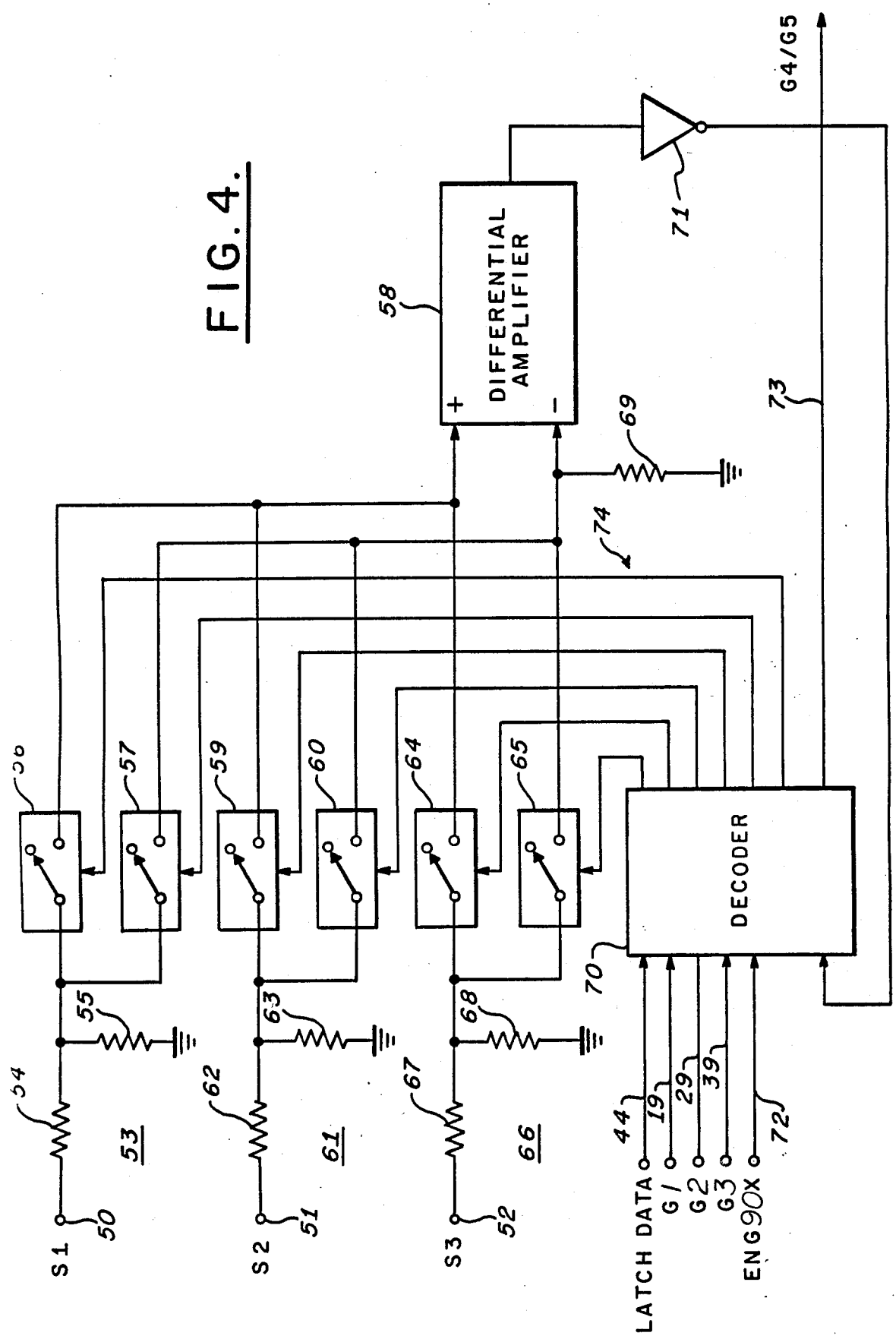

STEP DATA PROCESSOR FOR 180X AND 90X COMPASS SYNCHRO DATA

BACKGROUND OF THE INVENTION

1. Field of the Invention

The invention pertains to compass data converters particularly with respect to converting 180X and 90X compass synchro data into 1/6 degree resolution digital step data. The invention may be utilized in commercial marine radar displays requiring compass heading data to be utilized to provide a north of course stabilized display mode.

2. Description of the Prior Art

Present day gyro compasses provide a wide variety of heading data output formats. Gyro compasses traditionally provide output data in 360X synchro, 180X synchro, 90X synchro and 1/6 degree step formats. The synchro formats are utilized to enhance accuracy and resolution. For example, in a 360X system a synchro is geared to the compass output shaft to effect one mechanical revolution for each compass spacial degree. In such a configuration the gear ratio is 360:1. In the 180X synchro system, the synchro is geared to effect one mechanical revolution for two compass spacial degrees. In a similar manner the 90X synchro is geared to effect one mechanical revolution for four spacial degrees. The 1/6 degree step data output is generally utilized in a 360X system and provides a standard 3 digit grey code representing the 1/6 degree steps.

In gyro compass systems it is generally desirable to convert the output data thereof to digital format for transmission to remote apparatus. It is also desirable, for acceptable performance, to provide a minimum of 1/6 degree resolution. Therefore, it is a desideratum of the prior art to provide economical, low power apparatus to convert the wide variety of heading data formats available to digital step data with a minimum of 1/6 degree resolution. A low cost, low power prior art converter for transforming 360X synchro data to 3-digit grey code with 1/6 degree resolution is found in U.S. Pat. No. 4,031,531 issued June 21, 1977, entitled "Synchro-to-Digital Converter". Said patent 4,031,531 is incorporated herein by reference in its entirety. Further 360X converters may be found in U.S. Pat. No. 4,398,353 issued Aug. 16, 1983, entitled "Compass Data Converter" and in U.S. Pat. No. 4,401,932 issued Aug. 30, 1983, entitled "Syncro-to-Step Data Converter". Patents 4,398,353 and 4,401,932 are incorporated herein by reference in their entirety.

Apparatus is known in the prior art for providing 1/6 degree step data from 180X or 90X synchro-type compass systems but such apparatus is electromechanical and hence bulky, unreliable, and expensive. One such prior art system utilizes the synchro-type compass data to position a synchro servo system having an output linked through a gear train to a 1/6 degree step motor to provide the 1/6 degree compass step data. Another prior art system utilizes the synchro-type compass data to position a synchro servo system having an output linked through a gear train to an optical disc and decoder to provide the 1/6 degree compass step information. Because of the requirements of the synchro servo systems and the gear trains, each type of compass data output format requires a unique assembly. Additionally, the apparatus requires an excessive amount of space because of the synchro servo systems and the gear trains.

Synchro-to-digital converters for the various synchro data output formats are known which interface to the desired compass synchro data formats. Such converters, however, tend to be excessively expensive. The use of such converters in a low cost commercial compass system or commercial radar system would tend to be prohibitive.

SUMMARY OF THE INVENTION

The present invention overcomes the disadvantages of the prior art by providing simple, low cost and low power apparatus that provides 1/6 degree step data from a 180X or a 90X synchro-type compass. 180X synchro data is converted by utilizing a 360X to 1/6 degree step data converter that divides the synchro rotation into six 60° sectors providing a digital step data code representative thereof. Means responsive to the step data code and the 180X synchro output generates a first additional step data code digit representative of 30° subsectors of the 60 degree sectors. Preferably the step data code selects an appropriate synchro output and the polarity thereof is monitored with respect to ground to provide the first additional step data code digit.

The 90X synchro data is converted in response to the step data code, the first additional step data code digit and the synchro output by dividing the 30° subsectors into 15° subsectors and generating a second additional step data code digit representative thereof. Preferably the step data code and the first additional step data code digit selects the synchro output selected by the 180X conversion and a further synchro output which is scaled so that the scaled synchro output and the first selected synchro output are equal at the appropriate 15° points. A comparison between the scaled synchro output and the unscaled synchro output generates the second additional step data code digit.

Preferably, the 360x to 1/6 degree step data converter utilizes constant current sources for rectifying the synchro output signals into constant current levels.

BRIEF DESCRIPTION OF THE DRAWINGS

FIG. 2 also illustrates the synchro line voltages selected for the comparisons utilized in generating the 180X and 90X digital step data outputs.

FIG. 4 is a schematic block diagram of the logic and comparison network for the 180X synchro and 90X synchro conversion.

DESCRIPTION OF THE PREFERRED EMBODIMENT

Figure 1:
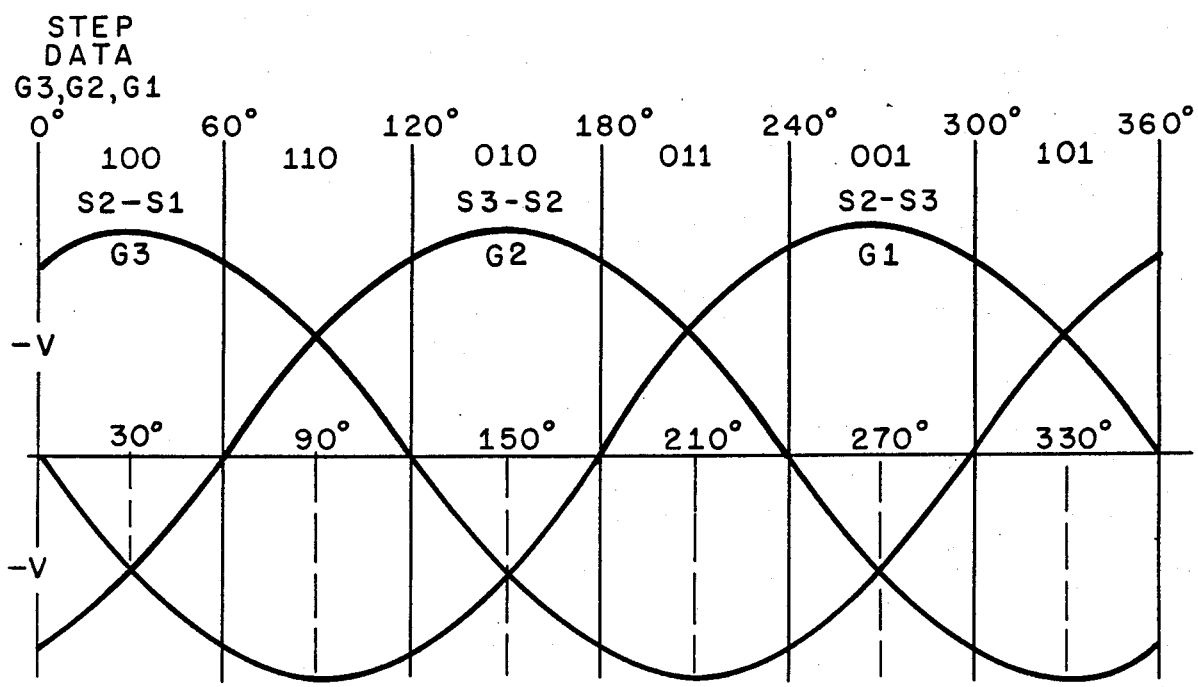
FIG. 1 is a graph illstrating the amplitude envelope of the synchro line outputs for one revolution of a typical compass synchro output.

The output of a synchro device such as utilized in a synchro-type compass comprises three synchro lines S1, S2, and S3 and two reference lines R1 and R2. The reference signal is typically a 60 or 400 Hz sine wave applied to the synchro rotor. Each of the three synchro lines provides an amplitude modulation of the reference sine wave where the amplitude modulation envelope is a sine wve generated in accordance with the angular position of the synchro. In accordance with the angular position of the rotor, the output of a synchro line may either be in phase with the reference signal or 180° out of phase with the reference signal. When the synchro line output is in phase with the reference signal the amplitude modulation is considered to be positive and when the synchro line output is out of phase with the reference signal, the amplitude modulation is considered to be negative. Thus each of the three synchro lines encodes the compass heading as an amplitude modulated sine wave. The amplitudes of the three synchro lines are 120° out of phase with respect to each other as follows:

$$S1 = K \sin(a) \sin(wt)$$

$$S2 = K \sin(a+120) \sin(wt)$$

$$S3 = K \sin(a-120) \sin(wt)$$

where
 K = amplitude constant,
 a = special angle in degrees
 wt = reference frequency Referring to FIG. 1, the sinusoidal amplitude envelopes with respect to the three synchro lines are illustrated where K is defined to be unity. The reference signal, sin (wt), is omitted for clarity. For convenience the amplitude envelope curves of FIG. 1 are provided across pairs of the synchro output lines.

The synchro output device is a 360X compass executes one mechanical revolution for each spacial compass degree. The mechanical-to-spacial degree gearing therefore provides a 360:1 ratio. In the device of said U.S. Pat. No. 4,031,531, one mechanical revolution of the synchro device is divided into six equal intervals of 60° each providing 1/6 spacial degree resolution. The six equal intervals are expressed in a 3-bit step data grey code G3, G2, G1. G3 represents the most significant step line 1, G2 represents the step line 2 and G1 represents the least significant step line 3.

FIG. 1 illustrates the methodology of said U.S. Pat. No. 4,031,531 for dividing the one mechanical revolution of the synchro device into six equal intervals to obtain the 1/6 spacial degree resolution. The curve denoted as G3 is obtained cross the synchro output lines S2-S1. The curve denoted as G2 is obtained across the synchro output lines S3-S2 and the curve denoted as G1 is obtained across the synchro output lines S1-S3. It is observed that in the first 60° sector (0°–60°) G3 is positive whereas G2 and G1 are negative. The step data code for this sector therefore is 100 where binary one denotes a positive voltage and binary zero denotes a negative voltage. It is observed that each 60° boundary only one of the synchro output curves changes polarity. A 3-bit grey code denoting the step data is therefore defined as illustrated.

Figure 3:
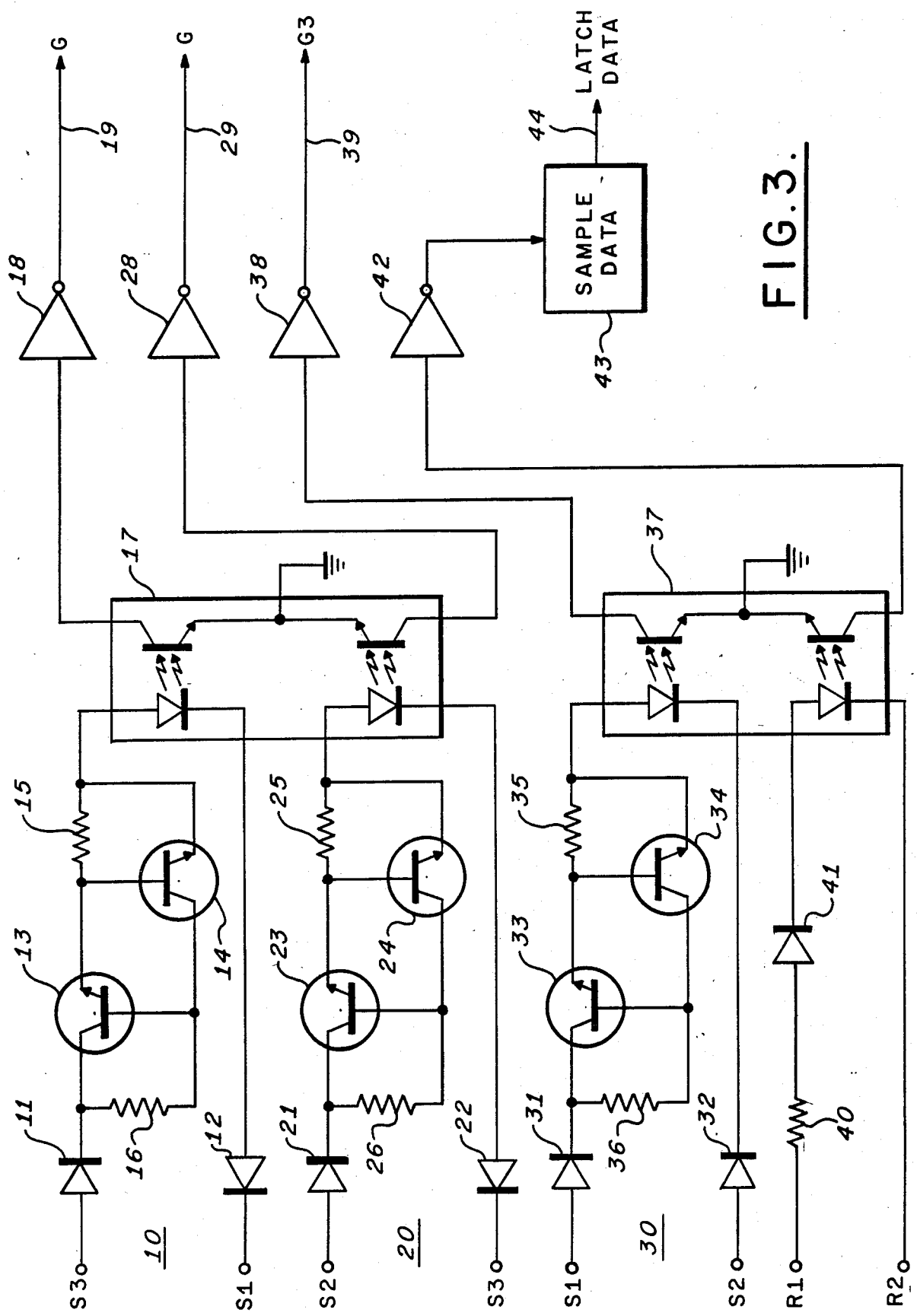
FIG. 3 is a schematic wiring diagram of the 360X synchro data and 1/6 degree step data converter utilized in the present invention.

Referring to FIG. 3 a schematic wiring diagram of a 360X synchro data-to-1/6 degree step data converter is illustrated. The converter of FIG. 3 utilizes the teachings of said U.S. Pat. No. 4,031,531. The synchro lines S1-S3 are rectified by a constant current half wave rectifier 10 comprised of diodes 11 and 12, transistors 13 and 14 and resistors 15 and 16. The synchro signal applied to the rectifier 10 is half wave rectified during the positive half cycles thereof. The transistors 13 and 14 with the resistors 15 and 16 comprise a constant current source that is turned on during these positive half cycles. The constant current rectified synchro signal is optocoupled by ½ of a dual optocoupler 17 to an inverting amplifier 18. The output of the inverting amplifier 18 provides the G1 signal on a line 19. It is appreciated that the G1 signal on the line 19 is a square wave output at the frequency of the synchro reference signal and either in phase or 180° out of phase therewith depending on the angular position of the synchro device output. The polarity information contained in the square wave signal on the line 19 with respect to the phase of the reference signal is utilized to provide the G1 digit of the step data code output as illustrated in FIG. 1 in a manner to be further described.

In a manner similar to that described above, the S3-S2 synchro lines are rectified by a constant current rectifier 20 comprised of diodes 21 and 22, transistors 23 and 24 and resistors 25 and 26. The rectified synchro signal is optocoupled by the other half of the dual optocoupler 17 to an inverting amplifier 28 to provide the G2 step data digit on a line 29.

Similarly the S2-S1 synchro lines are rectified by a constant current rectifier 30 comprised of diodes 31 and 32, transistors 33 and 34 and resistors 35 and 36. The rectified synchro signal is optocoupled by ½ of a dual optocoupler 37 to an inverting amplifier 38 to provide the G3 digit of the step data code on a line 39.

The square wave outputs on the lines 19, 29 and 39 are sampled at the reference frequency by applying R1-R2 to the second half of the optocoupler 37 through a resistor 40 and a diode 41. The reference frequency signal from the optocoupler 37 is applied through an inverting amplifier 42 to a sample data circuit 43. In response to the output of the inverting amplifier 42, the sample data circuit 43 provides Latch Data sampling pulses on a line 44 synchronous with respect to the synchro reference signal at a phase appropriate for sampling the signals on the lines 19, 29, and 39. The Latch Data pulses on the line 44 are utilized to sample the synchro output square wave signals on the lines 19, 29, and 39, in a manner to be described, so as to provide the step data code G1, G2 and G3 in sampled data format. In effect the components 37 and 40-44 synchronously demodulate the signals on the lines 19, 29 and 39 to provide the polarity information contained therein.

As is appreciated from FIG. 1, as the mechanical angle "a" of the synchro device increases from 0° to 360°, the polarities of the three synchro line samples G1, G2 and G3 change in such a manner as to generate the 3-bit step data grey code. The 3-bit grey code changes state every 60 mechanical degrees thereby dividing one mechanical revolution of the synchro output device into 6 sectors providing the desired 1/6 spacial degree resolution. The code is tabulated as follows:

TABLE 1

| MECH DEG | SPAT DEG | G3 | G2 | G1 |
|---|---|---|---|---|
| 0–60 | 0 to 1/6 | 1 | 0 | 0 |
| 60–120 | 1/6 to ⅓ | 1 | 1 | 0 |
| 120–180 | ⅓ to ½ | 0 | 1 | 0 |
| 180–240 | ½ to ⅔ | 0 | 1 | 1 |
| 240–300 | ⅔ to 5/6 | 0 | 0 | 1 |
| 300–360 | 5/6 to 1 | 1 | 0 | 1 |

It is appreciated that the 3-bit code G3, G2, G1 is the same code as that generated by a 1/6 degree step-type compass. With a 1/6 degree step-type compass there are 6 steps per mechanical revolution, each step defined by the 3-bit code. Thus each step represents 1/6 spacial degree.

The synchro output device of a 180X compass effects one mechanical revolution per two spacial degrees. The gear ratio in such a system is 180:1. If the 360X process or FIG. 3 is utilized in a 180X compass, a spacial resolution of only ⅓ degree would be provided (2 spacial degrees per revolution X one-sixth revolution/step). In accordance with the invention, obtaining 1/6 degree steps from the 180X compass utilizes the data provided by the 360X compass processor of FIG. 3. Each 60° interval defined by the 360X processor is divided in half into two 30° sectors to obtain the required resolution of 1/6 spacial degree/step.

Figure 2:
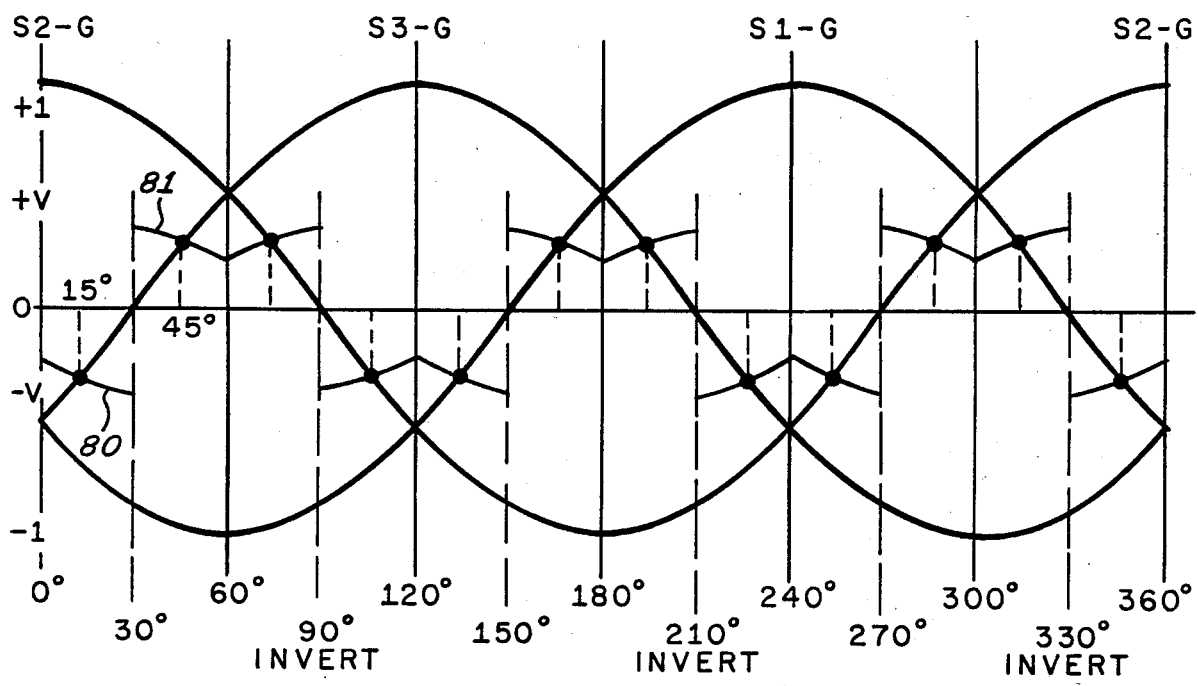
FIG. 2 is a graph illustrating the amplitude envelope of the synchro-to-ground lines utilized as inputs to the invention.

Referring to FIG. 2, the signal on each synchro output line S1, S2, and S3 with respect to ground is illustrated. It is appreciated that the boundaries of the half intervals required for the 180X processing occur when the mechanical angle is equal to odd multiples of 30°. FIG. 2 illustrates that at each odd multiple of 30°, one of the synchro-to-ground lines crosses through zero. Therefore, in accordance with the invention, the appropriate synchro-to-ground line is seleted and compared with ground potential to indicate whether the mechanical angle is prior to or subsequent to the sub-interval boundary. A binary result is obtained and appended to the three digit sttep code from the 360X processor to provide a four digit code. The four digit code defines 12 intervals/mechanical revolution or 1/6 spacial degree/step.

The data from the 360X processor is utilized to determine which one of the three synchro lines to compare to ground in each 60° sector. This data is tabulated as follows:

TABLE 2

| G3 | G2 | G1 | INPUT TO COMPARATOR |
|----|----|----|--------------------|
| 1  | 0  | 0  | S3-G               |
| 1  | 1  | 0  | S2-G (INVERT)      |
| 0  | 1  | 0  | S1-G               |
| 0  | 1  | 1  | S3-G (INVERT)      |
| 0  | 0  | 1  | S2-G               |
| 1  | 0  | 1  | S1-G (INVERT)      |

Thus it is appreciated that in the sector 0°-60°, S3-G is selected since this signal crosses zero at 30°. In the 0°-30° sub sector, S3-G is negative and in the 30°-60° sub sector S3-G is positive. In the 0°-30° sub sector the negative state of S3-G may be denoted by binary zero. In the sub sector 30°-60° the positive S3-G may be denoted by binary one.

In the sector 60°-120°, the synchro signal S2-G is selected. It is observed, however, that this signal crosses zero from positive to negative. In this sector the result of the comparison of S2-G to ground must be inverted with respect to the comparison made in the sector 0°-60° to obtain the correct result. Similar observations are made with respect to the remaining 60° sectors of the mechanical synchro revolution. The sectors in which inversion is required are denoted in the above Table 2.

It is appreciated that in the manner described above with respect to FIG. 1, each of the curves S1-G, S2-G, and S3-G represent the envelope of an amplitude modulated sinusoidal signal at the frequency of the synchro reference signal. The portions of the curves above the zero voltage axis represent the amplitude modulated sinusoidal signals in phase with the reference. The portions of the curve below the zero axis represent the amplitude modulated sinusoidal signals 180° out of phase with the reference. Thus in the 0°-60° Sector, S3-G is out of phase with the reference prior to 30° and in phase with the reference after 30°. In the 60°-120° sector, S2-G is in phase with the reference prior to 90° and out of phase with the reference subsequent thereto. This phase information that changes at the midpoint of each 60° interval with respect to the selected synchro-to-ground line is utilized to provide the binary result appended to the information from the 360X processor to provide the desired 1/6 degree spacial resolution.

Referring to FIG. 4, a schematic block diagram of apparatus for processing 180X synchro data and 90X synchro data is illustrated. The synchro lines S1, S2 and S3 are applied at terminals 50, 51, and 52 respectively. The S1 input at the terminal 50 is applied to a voltage divider 53 consisting of resistors 54 and 55. The output of the voltage divider 53 is applied as inputs to selector switches 56 and 57. The output of the selector switch 56 is applied to the non-inverting input of a differential amplifier comparator 58. The output of the selector switch 57 is applied to the inverting input of the differential amplifier comparator 58.

Similary, S2 is coupled to selector switches 59 and 60 via a voltage divider 61 comprised of resistors 62 and 63. The output of the selector switch 59 is coupled to the non-inverting input of the differential amplifier comparator 58 and the output of the selector switch 60 is coupled to the inverting input thereof. In a similar manner, the synchro output signal S3 is coupled to selector switches 64 and 65 via a voltage divider 66 comprised of resistors 67 and 68. The output from the selector switch 64 is coupled to the non-inverting input of the differential amplifier comparator 58 and the output of the selector switch 65 is coupled to the inverting input thereof. The inverting input of the differential amplifier comparator 58 is coupled to ground through a resistor 69 for reasons to be described. The resistors 55, 63 and 68 of the voltage dividers 53, 61, and 66 respectively are also connected to ground.

The output of the comparator 58 is applied to a decoder 70 via an inverting amplifier 71 the decoder 70 receives as inputs the Latch Data signal on the line 44 and the 360X step data signals G1, G2, and G3 on the lines 19, 29, and 39 respectively from FIG. 3. The decoder 70 also receives an enable 90X signal (EN90X) on a line 72. This signal controls the processor of FIG. 4 in accordance with whether the synchro input data S1, S2, and S3 are from a 180X compass or a 90X compass. In the 180X mode the decoder 70 utilizes the output of the comparator 58 to generate a fourth step data bit G4 on a line 73 to provide the desired 1/6 spacial ldegree resolution in a manner to be described. In the 90X mode, the line 72 is enabled and the decoder 70 first generates the bit G4 pursuant to the 180X procedure and then generates a fifth bit G5 on the line 73 to provide the desired 1/6 degree resolution in the 90X mode in a manner to be described. In both modes of operation the decoder 70 drives the selector switches 56, 57, 59, 60, 64, and 65 via lines 74 to connect the appropriate synchro signals to the inputs of the comparator 58. As previously described with respect to FIG. 3, the Latch Data signal on the line 44 provides sampling signals in synchronism with the synchro reference signal. The Latch Data signal is utilized by the decoder 70 to determine whether the output from the comparator 58 is in phase or out of phase with the synchro reference in determining the G4 and G5 bits.

With continued reference to FIGS. 2 and 4, when the synchro data to be converted is of the 180X, type the EN90X signal on the line 72 is pulled low. The Latch Data signal on the line 44 samples G1, G2 and G3 to provide the 360X step data information to the decoder 70 as delineated in Table 2. In the 180X mode of operation the decoder 70 controls the selector switches 57, 60, and 65 to remain in the open condition irrespective of the input bits G1, G2, and G3. The inverting input of the comparator 58 is thus held at ground potential through the resistor 69. The synchro-to-ground line signals S1-G, S2-G, and S3-G (FIG. 2) are generated by the voltage dividers 53, 61, and 66 respectively. In a conventional manner the decoder 70 is configured to activate the appropriate one of the selector switches 56, 59, and 64 in accordance with the latched 360X data bits G1, G2, and G3 so as to select the appropriate one of the synchro lines for connection to the non-inverting input of the comparator 58. The connections effected are delineated in Table 2 above. The decoder 70 also includes conventional circuitry to utilize the Latch Data signal on the line 44 to examine the output of the comparator 58 to determine if it is in phase or out of phase with the reference. Accordingly, the decoder 70 generates the G4 bit which is output on the line 73. The decoder 70 also utilizes the G1, G2, and G3 bits to determine whether or not G4 should be inverted as delineated in Table 2.

For example, in the 180X mode of operation when the synchro angle is in the 0°–60° sector, the decoder 70 closes the selector switch 64 to couple S3-G to the non-inverting input of the comparator 58 in response to the 100 input to the decoder 70 for the G3, G2, and G1 bits respectively. In the first half of this sector, the selected synchro signal S3-G is negative (out of phase with the reference) so that the decoder 70 provides G4 equal to binary zero on the line 73. As previously described, the Latch Data signal on the line 44 is utilized to effect this phase discrimination. If the mechanical synchro position is in the second half of the 60° sector, the selected synchro signal S3-G is positive (in phase with the reference) and the decoder 70 provides binary one on the line 73 as the G4 bit.

In the sector 60°–120°, S2-G is selected and, accordingly, the decoder 70 closes the selector switch 59. Since S2-G is positive (in phase with the reference) in the first half of the sector, and negative (out of phase with the reference) in the second half of the sector, the decoder 70 effects an inversion in providing the G4 bit for this sector.

Specifically, the processor of FIG. 4 operates to obtain 1/6 spacial degree resolution from a 180X compass as follows. The ⅙ spacial degree interval is etermined from the 3-bit grey code provided by the 360X processor of FIG. 3. Utilizing the 3-bit grey code from the 360X processor, the decoder 70 drives the appropriate selector switches, as described above, so as to compare the selected synchro-to-ground line to ground in the comparator 58. The output of the comparator 58 identifies the first or second 1/6 spacial degree sub interval and the decoder 70 utilizes this information to generate the data bit G4 on the line 73. The 180X conversion is tabulated as follows:

TABLE 3

| MECH DEG | SPAT DEG | G3 | G2 | G1 | G4 |
|---|---|---|---|---|---|
| 0–30 | 0 to 1/6 | 1 | 0 | 0 | 0 |
| 30–60 | 1/6 to ⅓ | 1 | 0 | 0 | 1 |

TABLE 3-continued

| MECH DEG | SPAT DEG | G3 | G2 | G1 | G4 |
|---|---|---|---|---|---|
| 60–90 | ⅓ to ½ | 1 | 1 | 0 | 0 |
| 90–120 | ½ to ⅔ | 1 | 1 | 0 | 1 |
| 120–150 | ⅔ to 5/6 | 0 | 1 | 0 | 0 |
| 150–180 | 5/6 to 1 | 0 | 1 | 0 | 1 |
| 180–210 | 1 to 7/6 | 0 | 1 | 1 | 0 |
| 210–240 | 7/6 to 4/3 | 0 | 1 | 1 | 1 |
| 240–270 | 4/3 to 3/2 | 0 | 0 | 1 | 0 |
| 270–300 | 3/2 to 5/3 | 0 | 0 | 1 | 1 |
| 300–330 | 5/3 to 11/6 | 1 | 0 | 1 | 0 |
| 330–360 | 11/6 to 2 | 1 | 0 | 1 | 1 |

When the processor of FIG. 4 is configured to perform a 90X conversion, the EN90X signal enables the line 72, reconfiguring the selector switch logic of the decoder 70 in a manner to be described. When the line 72 is enabled, the processor of FIG. 4 first performs the 180X conversion described above providing the G4 bit on the line 73. In the 90X mode the G4 bit is latched internally in the decoder 70 and the line 73 is thereafter utilized to provide a G5 bit.

The 90X compass effects one mechanical revolution per four spacial degrees. In the 90X mode, the processor of FIG. 4 divides the mechanical revolution into 24 intervals (6 steps per spacial degree ×4 spacial degrees per revolution) in order to obtain the desired spacial resolution of 1/6 degree. A unique 5 bit code, therefore, must be generated every 15 mechanical degrees.

The apparatus for generating the 1/6 spacial degree steps from the 90X compass data utilizes the results from the 180X conversion employing the same concept utilized for the 180X conversion. To obtain the 180X step data, the 60° intervals are divided in half into 30° sub-intervals by comparing selected synchro lines to ground. In the 90X converter, the 30° sub-intervals are divided in half and a relative magnitude comparison of selected synchro lines is performed to determine in which half of the sub-interval the mechanical angle resides.

Referring to FIG. 2, it is appreciated that the midpoint of each 30° sub-interval defined by the 180X process is an odd multiple of 15°. It is further appreciated that the synchro lines S1-G, S2-G, and S3-G do not provide a convenient procedure for distinguishing the odd multiple 15° points. There does not exist a crossover at these points as there does at the 30° odd multiple points. In accordance with the invention, in the 90X mode the same synchro line selected in the 180X mode is selected for a 90X comparison. One of the other synchro lines is also selected and scaled by a value so that the two signals will be equal at the 15° points. This scale factor, denoted as f, is derived as follows:

$$f \times S3(15) = S1(15)$$

$$f = S1(15)/S3(15)$$

$$f = \sin(15) \times \sin(wt) / \sin(15+120) \times \sin(wt)$$

$$f = \sin(15)/\sin(135)$$

$$f = 0.2588/0.7071$$

$$f = 0.3660$$

Refering still to FIG. 2, the unscaled synchro line signal and the scaled synchro line signal selected for each of the 30° sub-intervals are illustrated. As discussed above with respect to the 180X conversion, the synchro line S3-G is selected in the interval 0°-60° to divide this interval into sub-intervals. For the 90X conversion S3-G is also selected as one of the two synchro lines to be compared to the 0°-60° interval. In the 0°-30° sub-interval S1-G is scaled by the scale factor f yielding curve 80. It is observed that the curve 80 equals the curve S3-G at the 15° point. In the interval 0°-15° the curve 80 is more positive than the curve S3-G. In the interval 15°-30° the curve 80 is more negative than the curve S3-G. As previously described, in the interval 0°-30° both the curve 80 and the curve S3-G are negative these curves represent sinusoids 180° out of the phase with the synchro reference having the amplitudes illustrated in FIG. 2. In the interval 0°-15°, if the curve 80 is subtracted from the curve S3-G, the result will be a sinusoid out of phase with the synchro reference. If, however, in the internal 15°-30°, curve 80 is subtracted from S3-G, a sinusoid results that is in phase with the synchro reference. In other words, in the interval 0°-15° a less negative value is subtracted from a more negative value resulting in a negative value. In the interval 15°-30° a more negative value is subtracted from a less negative value and the result is a positive value. Thus, means are provided to determine whether the mechanical angle resides in the first or the second half of the interval 0°-30°.

In the interval 30°-60° the S3-G curve is selected and the S2-G curve is scaled to provide a curve 81. The same comparisons are made in the interval 30°-60° as described above with respect to the interval 0°-30°.

In the intervals 60°-90° and 90°-120°, scaled curves are illustrated and similar comparisons are effected as described above. The binary result obtained however must be inverted in performing the comparisons in the 60°-120° sector. The remaining sectors of FIG. 2 illustrate the selected scaled signals. Table 2 above delineates one of the synchro linesto be selected in accodance with the 360X 3-bit grey code. The following Table 4 delineates which synchro-to-ground line is selected for the scaled comparison based on the grey code and the latched G4 bit.

TABLE 4

| G3 | G2 | G1 | G4 | LINE TO BE SCALED |
|----|----|----|----|-------------------|
| 1 | 0 | 0 | 0 | S1-G |
| 1 | 0 | 0 | 1 | S2-G |
| 1 | 1 | 0 | 0 | S3-G (INVERT) |
| 1 | 1 | 0 | 1 | S1-G (INVERT) |
| 0 | 1 | 0 | 0 | S2-G |
| 0 | 1 | 0 | 1 | S3-G |
| 0 | 1 | 1 | 0 | S1-G (INVERT) |
| 0 | 1 | 1 | 1 | S2-G (INVERT) |
| 0 | 0 | 1 | 0 | S3-G |
| 0 | 0 | 1 | 1 | S1-G |
| 1 | 0 | 1 | 0 | S2-G (INVERT) |
| 1 | 0 | 1 | 1 | S3-G (INVERT) |

Referring to FIG. 4, the scale factor f is obtained by selecting the value of the resistor 69 such that the voltage provided by each of the voltage dividers 53, 61, and 66 through the switches 57, 60, and 65, respectively, to the inverting input of the comparator 58 will be 0.3660 times the voltage that would be provided by the voltage dividers 53, 61, and 66 through the switches 57, 60, and 65 in the absence of the resistor 69. The resistance of the selector switches are taken into acoount in determining the appropriate value for the resistor 69. In a preferred embodiment of the invention, the resistors 54, 62, and 67 are selected to be 33 kohms, the resistors 55, 63, and 68 are selected to 5.6 kohms, and the resistor 69 is selected to be 1.6 kohms.

Thus when the synchro-to-ground line seleted by the 180X processing is compared to the selected one of the other two synchro-to-ground lines multiplied by the scale factor f, the resultant output of the comparator 58 and the processing within the decoder 70 determines whether the mechanical angle is above or below the 15° point. This comparison provides the fifth bit G5 required to resolve the spacial angle to 1/6 degree for the 90X processor. In the 90X mode (EN90X high), the decoder 70 selects synchro-to-ground line for application to the non-inverting input of the comparator 58 pursuant to the 180X mode, internally latches the resultant G4 bit and outputs the G4 bit on the line 73. The decoder 70 then selects the line to be multiplied by the scale factor pursuant to the 3-bit grey code from the 360X processor and the internally latched G4 bit from the 180X processor. The selected scaled line is applied to the inverting input of the comparator 58 modifying the output thereof to provide the fifth bit G5 on the line 73.

For example, with reference to FIG. 2, if the mechanical angle resides in the sub-interval 0°-15° the G3, G2, and G1 bits 100 closes switch 64 for applying S3-G to the non-inverting input of the comparator 58. In the 180X portion of the comparison no other switches are closed and the bit G4 is generated, as described above, and latched internally in the decoder 70. The G3, G2, and G1 bits along with the G4 bit then closes switch 57 to apply the scaled S1-G signal to the inverting input of the comparator 58. As described above, this utilizes the curve 80 of FIG. 2. In the 0°-15° sub-interval the comparator 58 provides a signal to the decoder 70 that is out of phase with the synchro reference signal. As described above, the Latch Data signal on the line 44 detects this state producing a binary zero as the G5 bit. In the sub-interval 15°-30° the comparison provides an in phase signal resulting in a binary one for the G5 bit. In the sub-interval 30°-60° the switches 60 and 64 are closed to provide the G5 bit pursuant to the curve 81 (FIG. 2) as discussed above. In the interval 60-120 similar procedures are utilized except that the binary result is inverted to provide G5. Table 4 above delineates the sub sectors requiring inversion.

Summarizing, the 90X processor operates as follows. The 3-bit grey code is obtained from the 360X processor resolving the spacial angle to ⅔ degree (60 mechanical degrees). The 180X processor sub divides the interval in half, resolving the spacial angle to ⅓ degree. The 90X processor then sub divides the sub-interval into halves utilizing the scale factor f obtained from the resistor 69, resolving the spacial angle to 1/6 degree.

The 5-bit code is tabulated in Table 5 where G4 is the result of the first comparison from the 180X processor and G5 is the result of the second comparison from the 90X processor.

TABLE 5

| MECH DEG | SPAT DEG | G3 | G2 | G1 | G4 | G5 |
|----------|----------|----|----|----|----|----|
| 0–15 | 0 to 1/6 | 1 | 0 | 0 | 0 | 0 |
| 15–30 | 1/6 to ⅓ | 1 | 0 | 0 | 0 | 1 |
| 30–45 | ⅓ to ½ | 1 | 0 | 0 | 1 | 0 |
| 45–60 | ½ to ⅔ | 1 | 0 | 0 | 1 | 1 |
| 60–75 | ⅔ to 5/6 | 1 | 1 | 0 | 0 | 0 |
| 75–90 | 5/6 to 1 | 1 | 1 | 0 | 0 | 1 |
| 90–105 | 1 to 7/6 | 1 | 1 | 0 | 1 | 0 |
| 105–120 | 7/6 to 4/3 | 1 | 1 | 0 | 1 | 1 |
| 120–135 | 4/3 to 3/2 | 0 | 1 | 0 | 0 | 0 |

TABLE 5-continued

| MECH DEG | SPAT DEG | G3 | G2 | G1 | G4 | G5 |
|---|---|---|---|---|---|---|
| 135–150 | 3/2 to 5/3 | 0 | 1 | 0 | 0 | 1 |
| 150–165 | 5/3 to 11/6 | 0 | 1 | 0 | 1 | 0 |
| 165–180 | 11/6 to 2 | 0 | 1 | 0 | 1 | 1 |
| 180–195 | 2 to 13/6 | 0 | 1 | 1 | 0 | 0 |
| 195–210 | 13/6 to 7/3 | 0 | 1 | 1 | 0 | 1 |
| 210–225 | 7/3 to 5/2 | 0 | 1 | 1 | 1 | 0 |
| 225–240 | 5/2 to 8/3 | 0 | 1 | 1 | 1 | 1 |
| 240–255 | 8/3 to 17/6 | 0 | 0 | 1 | 0 | 0 |
| 255–270 | 17/6 to 3 | 0 | 0 | 1 | 0 | 1 |
| 270–285 | 3 to 19/6 | 0 | 0 | 1 | 1 | 0 |
| 285–300 | 19/6 to 10/3 | 0 | 0 | 1 | 1 | 1 |
| 300–315 | 10/3 to 7/2 | 1 | 0 | 1 | 0 | 0 |
| 315–330 | 7/2 to 11/3 | 1 | 0 | 1 | 0 | 1 |
| 330–345 | 11/3 to 23/6 | 1 | 0 | 1 | 1 | 0 |
| 345–360 | 23/6 to 4 | 1 | 0 | 1 | 1 | 1 |

It is appreciated from the foregoing that the Latch Data signal on the line 44 generated by the 360X processor of FIG. 3 provides sampling pulses synchronous with the synchro reference signal for providing samples of the G1, G2, and G3 signals for the decoder 70. The Latch Data signal is also utilized within the decoder 70 for examining the output of the comparator 58 to generate the G4 and G5 bits. An output utilization device (not shown) may also be included to gather the 3-bit code G1, G2, and G3; the 4-bit code G1, G2, G3, and G4; or the 5-bit code G1, G2, G3, G4, and G5 in accordance with whether 360X, 180X or 90X data, respectively, is being converted. The Latch Data signal may be utilized to strobe these bits into the utilization device.

If step data is available from a 180X compass or a 90X compass the apparatus of FIGS. 3 and 4 is utilized to provide the additional required bits with the step data applied to the rectifiers 10, 20, and 30. For example, if positive compass step data is utilized, the S3 step data may be applied to the upper leg of rectifier 10 through a suitable coupling device, such as a zener diode, with the lower leg of rectifier 10 suitably terminated. Similarly, the S2 and S1 positive compass step data may be applied to the upper legs, respectively, of the rectifiers 20 and 30 with the lower legs thereof suitably terminated. Negative step data is applied to the lower legs of the rectifiers with the upper legs suitably terminated. The negative compass step data S3, S2, and S1 are so applied to the rectifiers 10, 20, and 30 respectively.

It is appreciated that 1/6 degree step data effects transitions from logic one to logic zero and logic zero to logic one at the same angular positions as the envelope of the 360X synchro data. Thus 1/6 degree step data and 360X synchro data appear to the circuit of FIG. 3 as the same signal. The described transformations are performed by turning on and off the constant current sources at the same times for both types of data. Since the steps represented by the 4-bit 180X code and the 5-bit 90X code are electronically generated rather than mechanically or electromechanically generated, the present invention may be considered as a "pseudo" step compass processor.

The present invention utilizes constant current sources, as described above with respect to FIG. 3, to buffer 1/6 degree step data into digital levels. The use of constant current sources to buffer the data enbles the present invention to accept a wide variety of compass input voltages. The present invention accepts 360X synchro data, 180X synchro data, 90X synchro data, and 1/6 degree step data. The constant current sources are utilized in the circuit of FIG. 3 to convert the 360X synchro data into 1/6 degree steps. The relative amplitude of one, or two, of the three synchro lines are compared for the 180X and 90X synchro compass data formats, respectively. The synchro lines are selected by logic controlled switches. These comparisons in conjunction with the constant current source data, result in 1/6 degree steps for the 180X and 90X synchro compasses.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. An apparatus for converting synchro data provided at a plurality of synchro output terminals to 1/6 degree step data comprising:
   360X conversion means responsive to said synchro data at said plurality of synchro output terminals for providing a three digit step data code representative of 60° intervals of said synchro data at said plurality of synchro output terminals; and
   180X conversion means for generating an additional step data code digit representative of 30° intervals within said 60° intervals including:
      selector means responsive to said synchro data at said plurality of synchro output terminals and said three digit step data code for selecting one synchro output terminal of said plurality of synchro output terminals in accordance with said three digit step data code, and
      comparator means responsive to synchro data at said one synchro output terminals for comparing synchro data at said one synchro output terminal to a predetermined reference for generating said additional step data code digit.

2. The apparatus of claim 1 wherein said predetermined reference comprises ground.

3. The apparatus of claim 1, wherein said 360X conversion means comprises a plurality of constant current rectifying means respectively responsive to said synchro data at said synchro output terminals for providing said three digit step data code.

4. The apparatus of claim 1 wherein said synchro data at said plurality of synchro output terminals is referenced to a synchro reference signal and said 360X conversion means includes means responsive to said synchro reference signal for providing a sampling signal synchronous therewith.

5. The apparatus of claim 4 wherein said comparator means comprises differential amplifier means having a non-inverting input, an inverting input and an output providing the difference between said non-inverting input and said inverting input.

6. The apparatus of claim 5 wherein said selector means comprises
   a first plurality of selector switches arranged for selectively coupling said synchro output terminals to one input of said differential amplifier means,
   a second plurality of selector switches arranged for selectively coupling said synchro output terminals to an input of said differential amplifier means other than said one,
   said other than said one input of said differential amplifier means being coupled to receive said predetermined reference, and decoder means responsive to said three digit step data code, said sampling signal and said output of said differential amplifier means for selectively operating one of said first plurality of selector switches in accordance with said three digit step data code for coupling a selected synchro output terminal to said one input of said differential amplifier means, said decoder means including means responsive to said output of said differential amplifier means and said sampling signal for generating said additional step data code digit in accordance therewith.

7. The apparatus of claim 1 wherein said synchro data comprises 180X synchro data.

8. The apparatus of claim 1 wherein said synchro data comprises 90X synchro data, said apparatus further including 90X conversion means responsive to said synchro data, said three digit step data code and said additional step data code digit for generating a further additional step data code digit representative of 15° intervals of said 30° intervals.

9. The apparatus of claim 8 wherein said 90X conversion means comprises:

selector means responsive to said synchro data provided at said synchro output terminals, said three digit step data code and said additonal step data code digit for selecting two of said synchro output terminals in accordance with said step data code and said additional step data code digit, scaling means for scaling synchro data at one of said selected synchro output terminals by a predetermined scale factor, thereby providing scaled synchro data and comparator means responsive to said scaled synchro data and synchro data at a selected synchro output terminal other than said one for performing a comparison therebetween and generating said further additional step data code digit.

10. The apparatus of claim 9 wherein said scaling means scales synchro data at said one selected synchro output terminal to provide scaled synchro data at said one selected synchro output terminal that is equal to synchro data at selected synchro output terminal other than said one at boundaries of said 15° intervals.

11. The apparatus of claim 10 wherein said synchro data, at said plurality of output terminals is referenced to a synchro reference signal and said 360X conversion means includes means responsive to said synchro reference signal for providing a sampling signal synchronous therewith.

12. The apparatus of claim 11 wherein said comparator means comprises differential amplifier means having a non-inverting input, an inverting input and an output providing the difference between said non-inverting input and sid inverting input.

13. The apparatus of claim 12 wherein said scaling means comprises voltage dividing resistor means coupled to one of said inputs of said differential amplifier means.

14. The apparatus of claim 13 wherein said selector means comprises:

a first plurality of selector switches arranged for selectively coupling said synchro output terminals to an input of said differential amplifier means other than said one, a second plurality of selector switches arranged for selectively coupling said synchro output terminals to said one of said inputs of said differential amplifier means, and decoder means responsive to said three digit step data code, said sampling signal, said additional step data code digit and said output of said differential amplifier means for selectively operating said first plurality of selector switches to couple said selected synchro output terminal other than said one to said input of said differential amplifier means other than said one and for selectively operating said second plurality of selector switches to couple said synchro data at said one selected synchro output terminal scaled by said scaling means to said one input of said differential amplifier means, said decoder means including means responsive to said output of said differential amplifier means and said sampling signal for generating said further additional step data code digit in accordance therewith.

15. The apparatus of claim 14 wherein said decoder means includes means for storing said additional step data code digit.

16. The apparatus of claim 7 wherein said synchro data comprises compass step data output signals.

17. The apparatus of claim 8 wherein said synchro data comprises compass step data output signals.

* * * * *